United States Patent

Weber et al.

[11] Patent Number: 5,753,091
[45] Date of Patent: May 19, 1998

[54] CARRIER PALETTE FOR SUBSTRATES OF OPTICAL STORAGE MEDIA

[75] Inventors: Christoph Weber, Dreieich; Guenther Schmidt, Niedernhausen; Hartwig Fries, Weisbaden; Stephan Kueper, Taunusstein, all of Germany

[73] Assignee: Hoechst Aktiengesellschaft, Frankfurt, Germany

[21] Appl. No.: 758,974

[22] Filed: Dec. 2, 1996

Related U.S. Application Data

[63] Continuation of Ser. No. 466,187, Jun. 6, 1995, abandoned, which is a continuation of Ser. No. 230,202, Apr. 20, 1994, abandoned.

[30] Foreign Application Priority Data

May 5, 1993 [DE] Germany ............ 93 06 789 U

[51] Int. Cl.$^6$ .................................................. C23C 14/34
[52] U.S. Cl. .................. 204/298.15; 204/298.11; 204/192.2; 118/728
[58] Field of Search .............. 204/192.12, 192.2, 204/298.15, 298.11; 118/728, 729

[56] References Cited

U.S. PATENT DOCUMENTS

| | | | |
|---|---|---|---|
| 4,153,528 | 5/1979 | Dykeman et al. | 204/192 R |
| 4,558,388 | 12/1985 | Graves, Jr. | 204/298.15 X |
| 4,626,336 | 12/1986 | Bloomquist et al. | 204/192.2 X |
| 4,634,512 | 1/1987 | Allen et al. | 204/298.15 |
| 4,650,064 | 3/1987 | Slabaugh | 204/298.15 X |
| 4,735,701 | 4/1988 | Allen et al. | 204/298.15 |
| 5,244,555 | 9/1993 | Allen et al. | 204/298.15 X |

FOREIGN PATENT DOCUMENTS

| | | | |
|---|---|---|---|
| 0 006 475 | 1/1980 | European Pat. Off. | |
| 64-11972 | 1/1989 | Japan . | |
| 1298162 | 12/1989 | Japan | 204/298.15 |
| 2080568 | 3/1990 | Japan | 204/298.15 |
| 2-254645 | 10/1990 | Japan . | |
| 3082764 | 4/1991 | Japan | 204/298.15 |

*Primary Examiner*—Nam Nguyen
*Attorney, Agent, or Firm*—Foley & Lardner

[57] ABSTRACT

A carrier palette useful for receiving at least one of a plurality of disc-shaped substrates of optical storage media, wherein the carrier palette comprises one or a plurality of circular depression adapted to receive said substrates, and wherein the diameter of the depressions is greater than the diameter of the substrates to be received. The carrier palette can be used to produce optical storage media of improved climatic stability with minimal edge splintering.

12 Claims, 2 Drawing Sheets

CARRIER PALETTE FOR SUBSTRATES OF OPTICAL STORAGE MEDIA

This application is a continuation of application Ser. No. 08/466,187, filed Jun. 6, 1995, abandoned which is a continuation of Ser. No. 08/230,202, filed on Apr. 20, 1994 abandoned.

BACKGROUND OF THE INVENTION

1. Field of the Invention

The invention relates to a carrier palette for substrates of optical storage media which carrier palette is capable of receiving one or a plurality of substrates in disc form.

2. Description of Related Art

In the case of known carrier palettes, the substrates of storage media such as optical and magnetooptical storage discs onto which a recording layer is to be sputtered, are placed onto the palette, which is then guided through a vacuum sputtering system. In this case, the substrates of the storage discs rest by their lower surface snugly on the surface of the carrier palette, so that the edges of the substrates lie free. As a result of this arrangement, the edges of the substrates are exposed without protection to the plasmas in the high voltage discharge which occur in the sputtering system, during the sputtering of a plurality of targets. This edge exposure leads to a situation in which the plasmas or the UV radiation created in the plasmas leads to a decomposition of the surface of the substrates which are in general composed of polymers.

After the sputtering of the recording layers onto the substrates, the next working process to take place is the application of a UV protective lacquer layer onto the finished storage discs. This gives rise to the disadvantage that the edges of the substrates exhibit a chemically modified surface as a consequence of the plasma influences or of the action of the UV radiation in the plasmas; this gives rise to a lower degree of adhesion of the UV protective lacquer layer than on the remainder of the surface of the storage discs. As a result of this, the climatic stability of the storage discs is greatly impaired, since the UV protective lacquer splinters off from the edges of the storage discs after a certain time and the lacquer splinters considerably disturb both the inscription of data and also the readout of the data. In use this can lead to data losses.

SUMMARY OF THE INVENTION

Accordingly, an object of the present invention is to improve the climatic stability of optical storage discs and to prevent the splintering off of lacquer layers from the edges of the storage discs, and to provide storage discs having these qualities.

It is also an object of the invention to provide carrier palettes which can be used in processes for the production of storage discs, so that the resulting storage disk avoids the aforementioned problems.

In accomplishing the foregoing objectives, there has been provided, in accordance with one aspect of the invention a carrier palette useful for receiving at least one of a plurality of disc-shaped substrates of optical storage media, wherein the carrier palette comprises one or a plurality of circular depressions adapted to receive said substrates, and wherein the diameter of the depressions is greater than the diameter of the substrate to be received.

In accordance with another aspect of the present invention, there has been provided a carrier palette carrying one or a plurality of disc-shaped substrates of optical storage media, wherein the carrier palette comprises one or a plurality of circular depressions adapted to receive said substrates, and wherein the diameter of the depressions is greater than the diameter of the corresponding substrate.

Further objects, features, and advantages of the present invention will become apparent from a detailed description of preferred embodiments which follows.

DETAILED DESCRIPTION OF THE PREFERRED EMBODIMENTS

Figure 1:
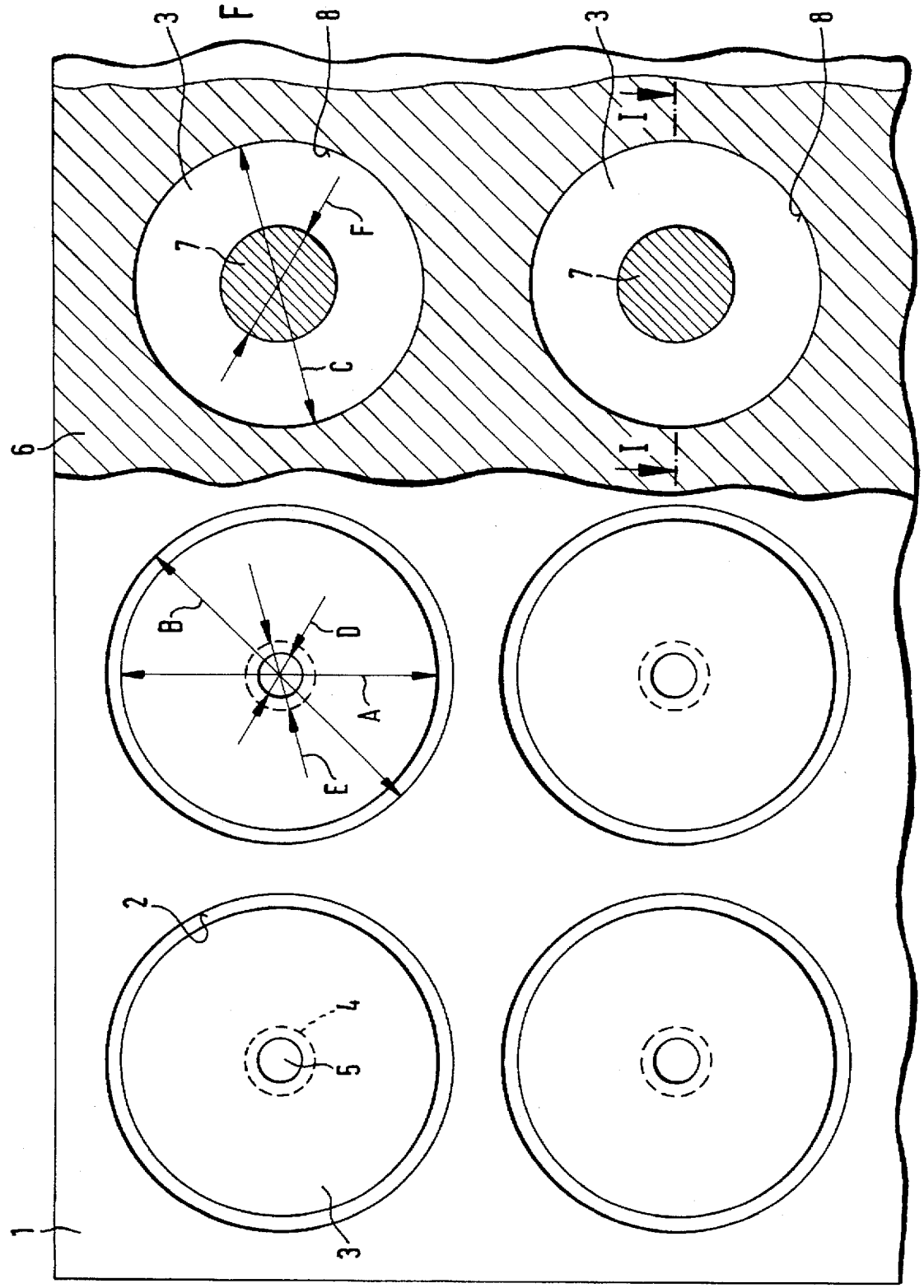
FIG. 1 shows a partly broken away, plan view of a carrier palette according to the invention.

The present invention is directed to a carrier palette containing one or more circular depressions wherein each depression is capable of receiving a disc-shaped substrate. Any carrier palette meeting these requirements is within the scope of the invention. Circular is used in the specification to mean circular or approximately circular, such that the circular depressions are capable of receiving a disc-shaped substrate.

In a further refinement of the invention, a mask rests flat on the carrier palette and exhibits, corresponding to the circular depressions, circular openings having a diameter smaller than the diameter of the substrates.

In a further refinement of the invention, each of the depressions exhibits a central overlay, on which the substrate rests. The depth of the depression is at least as deep as the substrate is thick and preferably 0 to 4 mm, preferably 1 to 2 mm, greater than the thickness of the substrate.

Expediently, each substrate includes a central hole having a diameter which is smaller than the diameter of the overlay. Preferably, a mask of T-shaped cross-section is fitted in the central hole, in which case the transverse part of the mask possesses a diameter greater than the diameter of the vertical part of the mask. In a further development of the invention, the diameter of the transverse part of the mask is greater than the diameter of the central hole in the substrate.

Since the substrates are located in the depressions of the carrier palette during the sputtering process, and the margins or edges of the storage discs are preferably covered over by a mask during the sputtering process, the edges of the substrates are to a large extent screened off against plasma influences, so that the polymer surface of the edges cannot be altered by the action of the plasmas. As a result of this, the edges of the finished storage discs possess the same power of adhesion for a UV protective lacquer as the remaining surfaces of the storage discs.

The invention is explained in greater detail hereinbelow with reference to an embodiment which has been shown in the drawing:

As is evident from FIG. 1, depressions 2 are provided in rows and columns in a carrier palette 1. In these depressions, substrates 3 are disposed, which substrates are later coated with a recording layer in a vacuum sputtering system. Each substrate 3 possesses a central hole 5. The non-hatched left-hand region of FIG. 1 shows the carrier palette 1 with the substrates 3 inserted in the depressions 2 without covering over by appropriate masks. The central hole 5 has a diameter D, which is smaller than a diameter E of an overlay 4, which is disposed at the center of the depression 2 and the margin of which is shown in broken lines. A diameter B of the depression 2 is greater than a diameter A of the substrate 3.

In the hatched right-hand region of FIG. 1, the substrates 3 covered over by a continuous mask 6 at their outer margins are shown. The mask 6 rests flat on the carrier palette 1 and exhibits, corresponding to the depressions 2, circular recesses 8 having a diameter C which is smaller than the diameter A of the substrates 3. The difference between the diameters A and C is 1 to 6 mm, in other words the margin of each substrate 3 is covered over 0.5 to 3 mm by the mask 6.

The substrates 3 can be any disc-shaped substrate and generally have a thickness of 1 to 1.5 mm, especially of 1.2 mm, and can exhibit various diameters, for example, of 2½, 3½, 5¼ inch or 12 inch. The carrier palette 1 can receive a specified number of substrates, as a function of the diameter of the substrates.

Figure 2:
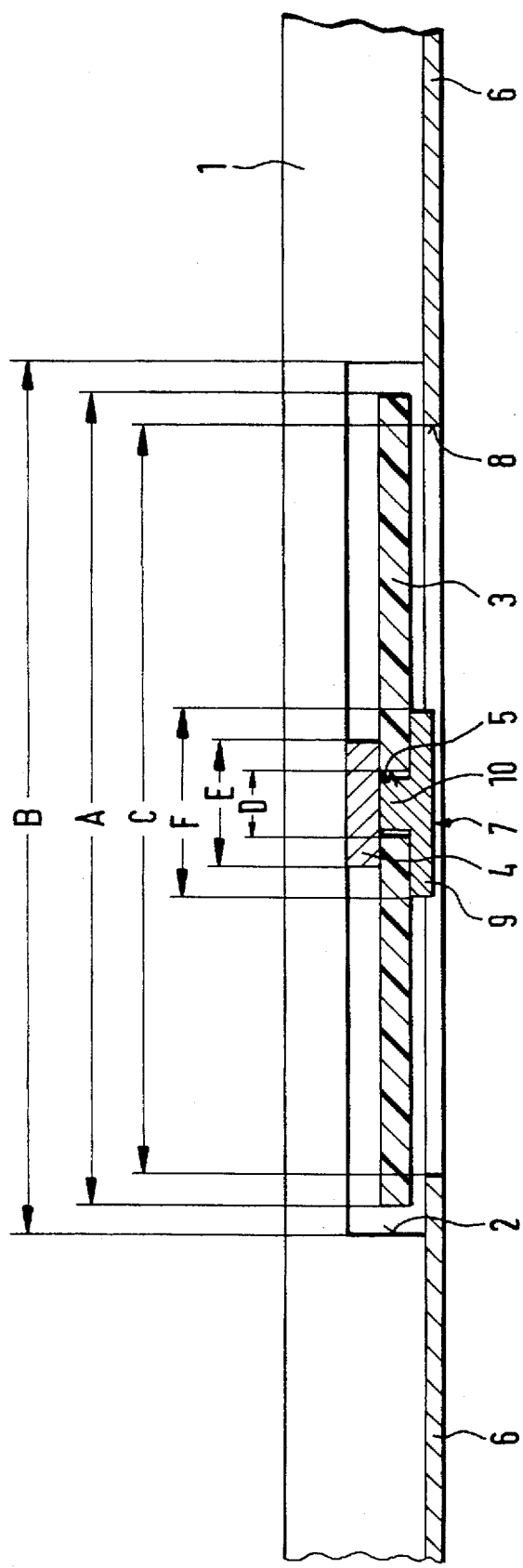
FIG. 2 shows a cross-section through a depression of the carrier palette, along the line I—I in FIG. 1, on an enlarged scale.

FIG. 2 shows a cross-section along the line I—I of a depression 2 of FIG. 1. Beside the mask 6 a further mask 7 is also present, which protects the edges or margins of the central hole 5 of the substrate 3 against the plasma influences during the sputter coating. The substrate 3 rests on the central overlay 4. The depth of the depression 2 is approximately 0 to 4 mm greater than the thickness of the substrate 3. The mask 7 of T-shaped cross-section is inserted into the central hole 5, the transverse part 9 of the mask 7 possessing a greater diameter F than the vertical part 10 of the mask 7, which vertical part fills the central hole 5. The diameter F of the transverse part 9 of the mask 7 is on its part greater than the diameter D of the central hole 5 in the substrate 3. The mask 7 rests snugly on the substrate surface and ensures that the margins or edges of the central hole 5 are covered over. Likewise, the overlay 4 ensures that the central hole 5, seen from the rear surface of the substrate 3, is fully covered over. Thus, during the sputter coating the substrate 3 rests in the depression 2 of the overlay 4 and is protected by the mask 6, along the outer margin, and by the further mask 7 with respect to the central hole 5, against the plasma influences.

Optical and magnetooptical storage discs which are introduced into such a carrier palette 1 during sputtering and, after the sputtering of the recording layer, are coated with a UV protective lacquer, show a significantly improved climatic stability. In a high temperature high humidity climatic test, no splintering off of the UV protective lacquer from the substrate 3 takes place with such storage discs, even after 1000 hours.

What is claimed is:

1. A carrier palette for receiving at least one of a plurality of disc-shaped substrates having an outer peripheral contour of optical storage media, the carrier palette comprising:

one or a plurality of circular depressions having an inside to which a reverse side of a substrate inserted in each depression maintains a determined distance, wherein the diameter of the depressions is greater than the diameter of the substrates to be received; and a mask which rests flat over the entire surface of the carrier palette and, corresponding to the depressions, exhibits circular openings each having a diameter that is smaller than the diameter of the corresponding substrate to be received;

wherein the outer margin of each substrate is covered by said mask;

wherein each of the depressions has a central overlay, on which a reverse side of a substrate rests, and wherein the depth of the depression is up to 4 mm greater than the thickness of the substrates to be received;

wherein each substrate to be received includes a central hole having a diameter which is smaller than the diameter of the central overlay which is disposed at the center of each depression.

2. A carrier palette as claimed in claim 1, wherein a mask of T-shaped cross-section is fitted in the central hole in the substrate, the transverse part of the T-shaped mask possessing a diameter greater than the diameter of the vertical part of the T-shaped mask.

3. A carrier palette as claimed in claim 2, wherein the diameter of the transverse part of the T-shaped mask is greater than the diameter of the central hole in the substrate.

4. A carrier palette as claimed in claim 3, wherein the substrates have a thickness of from about 1 to about 1.5 mm.

5. A carrier palette as claimed in claim 3, wherein the diameter of the substrates is from about 2.5 to about 12 inches.

6. A carrier palette as claimed in claim 1, wherein the depressions have a depth which is 1 to 2 mm greater than the thickness of the substrate to be received.

7. A carrier palette carrying one or a plurality of disc-shaped substrates having an outer peripheral contour of optical storage media, the carrier palette comprising:

one or a plurality of circular depressions having an inside to which a reverse side of a substrate inserted in each depression maintains a determined distance, which receive said substrates, wherein the diameter of each depression is greater than the diameter of the substrate to be received; and a mask which rests flat over the entire surface of the carrier palette and, corresponding to the depressions, exhibits circular openings each having a diameter smaller than the diameter of the substrate;

wherein the edges of said circular openings cover the outer contours of the substrates;

wherein each substrate has a central hole, and wherein the edges of each central hole and the outer edge of the substrates are covered by a further mask.

8. A carrier palette as claimed in claim 7, wherein each of the depressions exhibits a central overlay, on which the substrate rests, and wherein the depth of the depression is 1 to 4 mm greater than the thickness of the substrate.

9. A carrier palette as claimed in claim 8, wherein each substrate includes a central hole having a diameter which is smaller than the diameter of the overlay.

10. A carrier palette as claimed in claim 9, wherein a mask of T-shaped cross-section is fitted in the central hole, the transverse part of the T-shaped mask possessing a diameter greater than the diameter of the vertical part of the T-shaped mask.

11. A carrier palette as claimed in claim 10, wherein the diameter of the transverse part of the T-shaped mask is greater than the diameter of the central hole in the substrate.

12. A carrier palette as claimed in claim 8, wherein the depressions have a depth which is 1 to 2 mm greater than the thickness of the corresponding substrate.

* * * * *